(12) United States Patent
Weber

(10) Patent No.: US 7,362,520 B2
(45) Date of Patent: Apr. 22, 2008

(54) DEVICE FOR THE LOW-DEFORMATION MOUNTING OF A ROTATIONALLY ASYMMETRIC OPTICAL ELEMENT

(76) Inventor: Ulrich Weber, Ensingerstrasse 53, D-89073 Ulm (DE)

(*) Notice: Subject to any disclaimer, the term of this patent is extended or adjusted under 35 U.S.C. 154(b) by 81 days.

(21) Appl. No.: 10/964,601

(22) Filed: Oct. 12, 2004

(65) Prior Publication Data
US 2005/0052760 A1 Mar. 10, 2005

Related U.S. Application Data

(63) Continuation of application No. PCT/EP03/03561, filed on Apr. 5, 2003.

(30) Foreign Application Priority Data
Apr. 12, 2002 (DE) .................. 102 16 114

(51) Int. Cl.
*G02B 7/02* (2006.01)
(52) U.S. Cl. .................. 359/819; 359/811; 359/813; 359/821; 359/822; 359/823
(58) Field of Classification Search .......... 359/819, 359/811, 813, 822, 821, 823
See application file for complete search history.

(56) References Cited

U.S. PATENT DOCUMENTS 4,155,642 A 5/1979 Lacombat

| 6,229,657 | B1 | 5/2001 | Holderer et al. |
| 6,400,516 | B1* | 6/2002 | Spinali .................. 359/819 |
| 6,580,570 | B2 | 6/2003 | Becker et al. |
| 6,594,093 | B2 | 7/2003 | Moeller et al. |
| 6,667,839 | B2 | 12/2003 | Hartmaier et al. |
| 6,687,057 | B1* | 2/2004 | Yamazaki ............. 359/637 |
| 6,733,369 | B1 | 5/2004 | Stacklies et al. |
| 6,798,588 | B2 | 9/2004 | Vogt |

FOREIGN PATENT DOCUMENTS

| CH | 371906 | 10/1963 |
| DE | 3406907 A1 | 10/1984 |
| FR | 2 555 766 | 11/1983 |
| WO | WO03/081337 A2 | 3/2003 |

OTHER PUBLICATIONS

Yoder, Paul R., Critical Review vol. CR43, Optomechanical Design/ 353, 1 page.

* cited by examiner

*Primary Examiner*—Scott J. Sugarman
*Assistant Examiner*—Brandi N Thomas
(74) *Attorney, Agent, or Firm*—Wells St. John P.S.

(57) ABSTRACT

A low-deformation mounting device of a rotationally asymmetric optical element, particularly an optical element in a projection lens used in semiconductor lithography. Said optical element is mounted in a frame and is provided with at least three connection surfaces that are positioned perpendicular to each other. Frame-connecting members are disposed in such a way that at least one but no more than two degrees of translational freedom and at least one but no more than two degrees of rotational freedom are obtained by means of said connecting members.

21 Claims, 4 Drawing Sheets

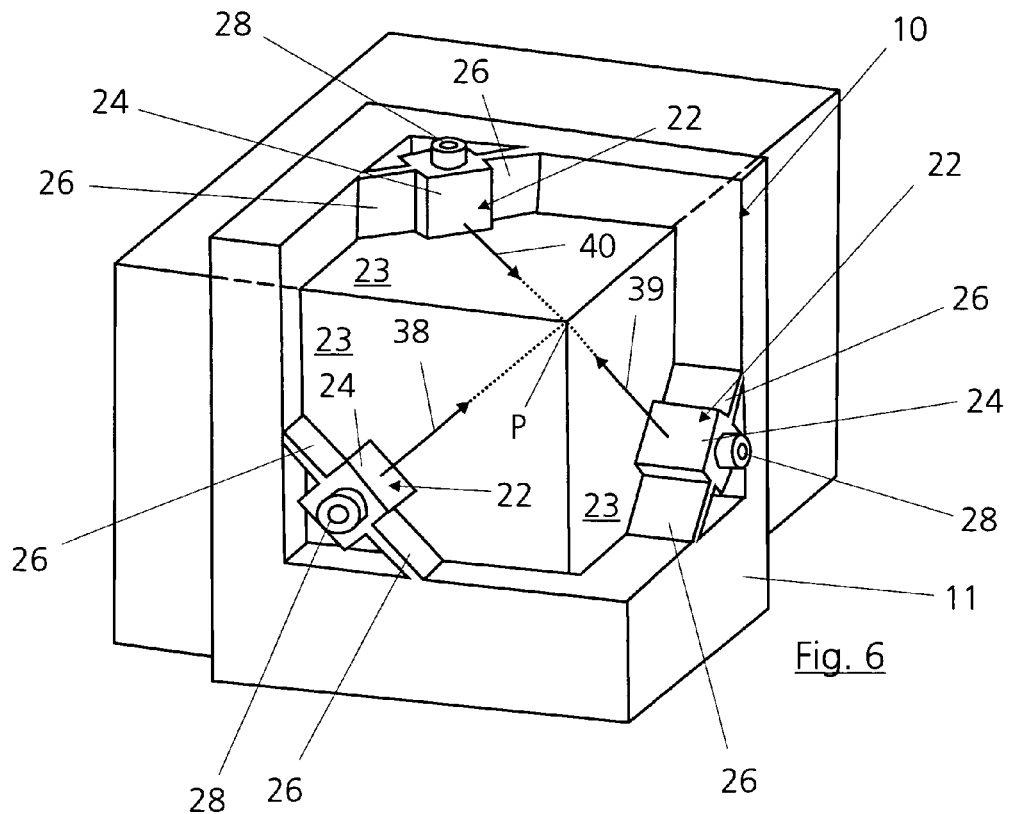
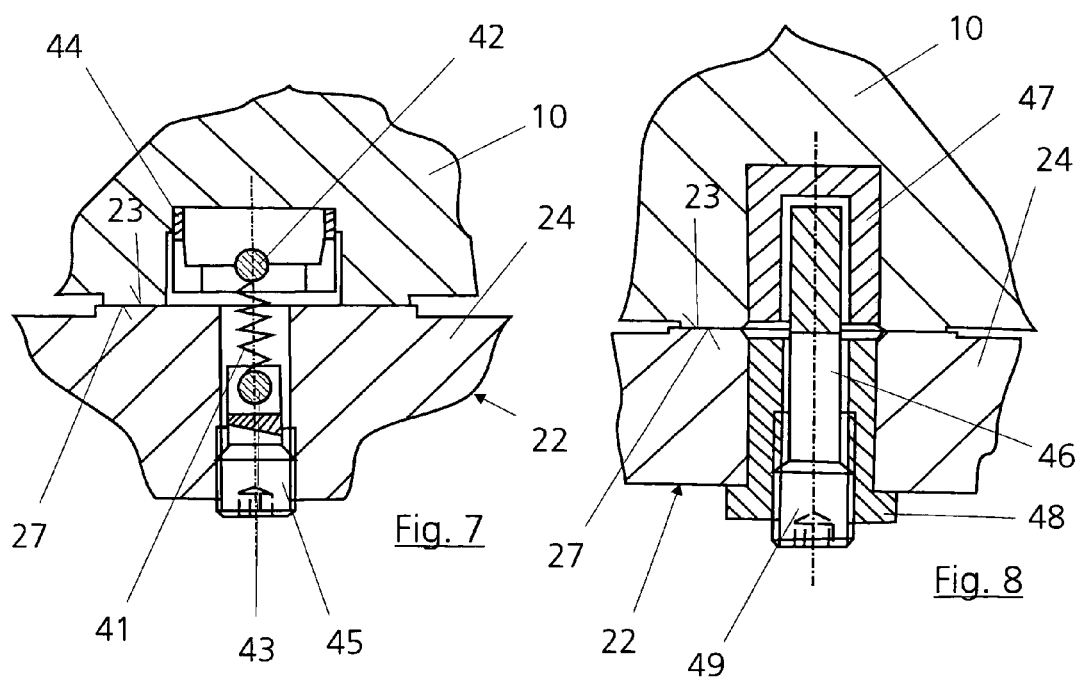

DEVICE FOR THE LOW-DEFORMATION MOUNTING OF A ROTATIONALLY ASYMMETRIC OPTICAL ELEMENT

CROSS REFERENCE TO RELATED APPLICATION

This application is a Continuation application of PCT/EP03/003561 and claims priority to PCT International Application No. PCT/EP03/003561, which was filed 05 Apr. 2003, and was published in German which was based on German Patent Application No. 102 16 114.3 which was filed 12 Apr. 2002 and the teachings of which are incorporated herein by reference.

BACKGROUND OF THE INVENTION

1. Field of the Invention

The invention relates to a device for the low-deformation mounting of a rotationally asymmetric optical element, in particular of an optical element in a projection lens system for semiconductor lithography, which is mounted in a frame.

2. Description of the Related Art

In particular in the case of projection lens systems in semiconductor lithography for producing semiconductor elements, it is necessary to know the precise installation position of an optical element or of an optical subassembly in relation to reference surfaces. Furthermore, it is often necessary for an optical element or a subassembly, following removal and reinstallation, to be positioned precisely in relation to the previous position, it also being intended, in particular, for the same, or at least very similar, deformation to occur as in the case of installation first time around, in order that reproducibility is achieved and there are no chances in respect of the imaging quality of the projection lens system.

A reproducible installation position and at least more or less identical deformation forces are particularly difficult to achieve in the case of rotationally asymmetric optical elements. This applies, in particular, to beam splitter cubes, prisms and double mirrors.

SUMMARY OF THE INVENTION

The object of the present invention is thus to provide a mounting which is intended for a rotationally asymmetric optical element and by means of which reproducibility is achieved, in particular following removal and reinstallation. The intention, in particular, is for external influences during installation and operation not to give rise to any chances in the original deformation of the optical element.

This object is achieved according to the invention by a device, the optical element being mounted in a frame such that at least three application surfaces are provided on the optical element, in an angle in relation to one another, preferably orthogonally, wherein attachment members for attachment to the frame being arranged such that in each case at least one but not more than two degree/s of translational freedom and degree/s of rotational freedom is/are provided by the attachment members.

The mounting according to the invention achieves reproducibility for reinstallation of the optical element, the original deformation forces also being reproduced or maintained. This is the case, in particular, when the attachment members are each provided with a connecting member via which the optical element is fixed to the frame.

One of the essential features of the invention is that two degrees of translational freedom are available at each attachment location during installation. Following installation, that is to say following connection of each attachment location to the optical element via a connecting member, one degree of translational freedom is eliminated. This renders the mounting stiffer overall, as a result of which vibrations can be better avoided.

The attachment members will be very advantageously designed as solid-state articulations, it being possible for these to have leaf-spring-like, elastic elements.

Such a mounting is free of play.

If mounting via at least two leaf-spring-like elastic elements which are arranged perpendicularly to one another is provided, then there are still two degrees of translational freedom following installation, redundancy of the mounting being avoided as a result.

A very advantageous configuration of the invention is achieved if it is provided that the lines of effect of the possible lateral translational movements intersect one another at a point.

This arrangement gives rise to temperature compensation since, in the case of different temperature expansions of the optical element and frame, the attachment locations and/or bearing points move such that the optical element does not have to change shape.

An advantageous configuration of straightforward design is achieved when the attachment members slant in relation to the edges of the optical element, the lines of effect of the possible lateral translational movements intersecting one another at a corner of the optical element. In the case of an optical element forming a cube, this makes it possible to expand or contract, true to form, from the corner of the cube as fixed point.

Advantageous further configurations and developments of the inventions can be seen from the exemplary embodiments which are described in principle hereinbelow with reference to the drawings.

BRIEF DESCRIPTION OF THE DRAWINGS

FIG. 6 shows a beam splitter cube in a configuration with obliquely positioned mounting devices;

FIG. 7 shows an adjustable contact-pressure device with a spring; and

FIG. 8 shows an adjustable contact-pressure device with a magnet.

DETAILED DESCRIPTION

Figure 1:
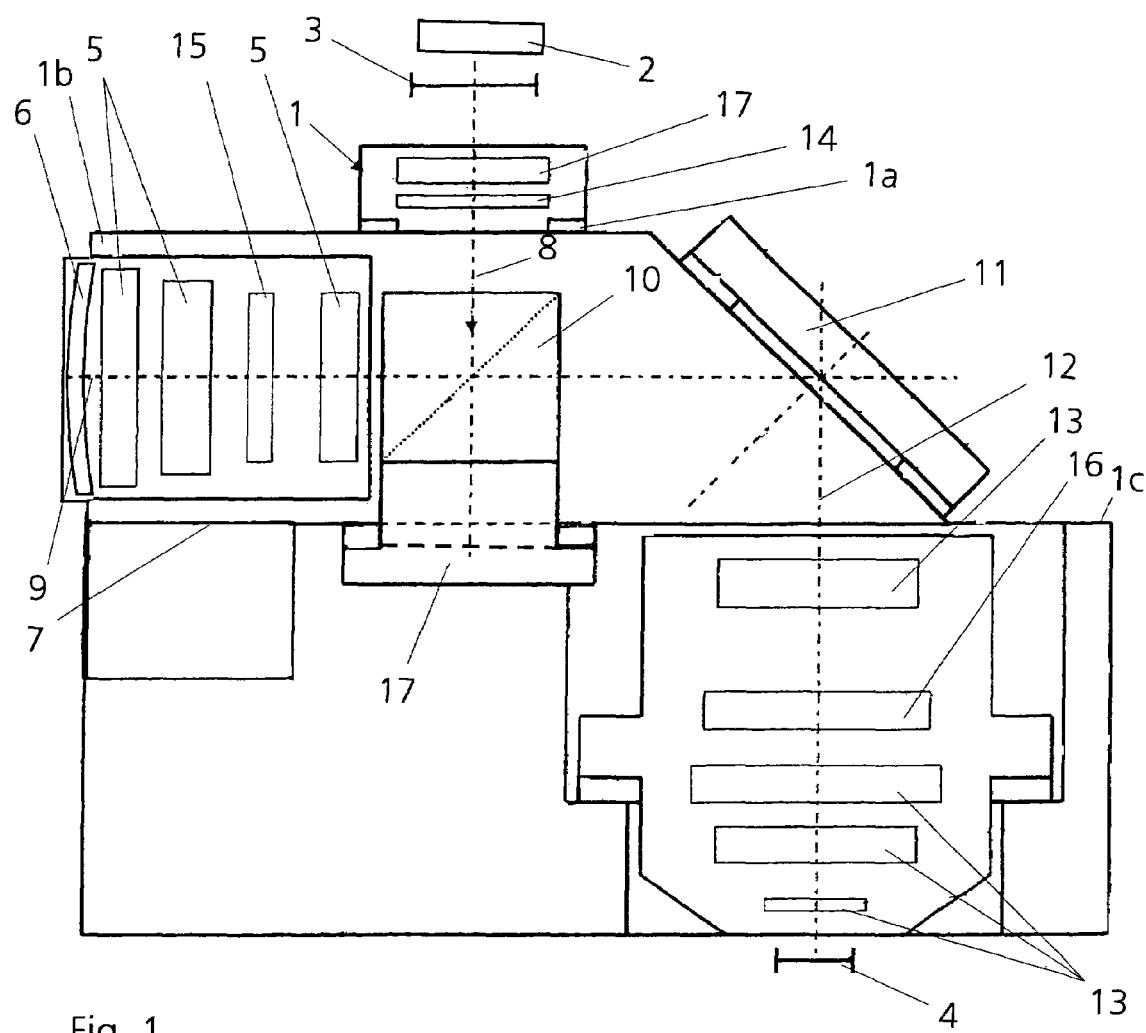
FIG. 1 shows a schematic illustration of a projection exposure installation with a projection lens system.

FIG. 1 illustrates., in principle, a projection exposure installation with a projection lens system 1 for microlithography for producing semiconductor elements.

It has an illuminating system 2 with a laser (not illustrated) as light source. Located in the object plane of the projection exposure installation is a reticle 3, of which the structure is to be replicated, on a correspondingly reduced scale, on a wafer 4 which is arranged beneath the projection lens system 1 and is located in the image plane.

The projection lens system 1 is provided with a first vertical lens-system part 1a and a second horizontal lens-system part 1b. Located in the lens-system part 1b are a plurality of lenses 5 and a concave mirror 6, which are arranged in a lens-system housing 7 of the lens-system part 1b. A beam splitter cube 10 is provided in order to deflect the projection beam (see arrow) from the vertical lens-system part 1a, with a vertical optical axis 8, into the horizontal lens-system part 1b, with a horizontal optical axis 9.

Following reflection of the beams on the concave mirror 6 and subsequent passage through the beam splitter cube 10, these beams impinge on a deflecting mirror 11. The horizontal beam path 9 is deflected at the deflecting mirror 11, in turn, into a vertical optical axis 12. A third vertical lens-system part 1c with a further lens group 13 is locates beneath the deflecting mirror 11. In addition, three λ/4 plates 14, 15 and 16 are also located in the beam path. The λ/4 plate 14 is located in the projection lens system 1, between the reticle 3 and the beam splitter cube 10, behind a lens or lens group 17. The π/4 plate 15 is located in the beam path of the horizontal lens-system part 1b, and the λ/4 plate 16 is located in the third lens-system part 1c. The three λ/4 plates serve to provide one full rotation of the polarization, as a result of which, inter alia, beam losses are minimized.

FIGS. 2 to 8 use an enlarged illustration to describe in more detail the beam splitter cube 10 wish its bearing devices which is illustrated in FIG. 1. The beam splitter cube 10 is mounted in a frame 21 which is fixed, in a manner which is not illustrated specifically, to the projection lens system 1.

The beam splitter cube 10 is mounted in the frame 21 via three attachment members 22, which act on three attachment surfaces 23 of the beam splitter cube 10 which are located perpendicularly to one another or orthogonally in relation to one another. As can be seen from FIG. 2, the attachment members 22 are designed as solid-state articulations and are integral with the frame 21. As can also be seen from FIG. 2, the attachment surfaces 23 constitute three sides of the beam splitter cube 10. According to FIG. 3, each attachment member 22 has a central part 24 with a threaded bore 25 and two laterally adjoining leaf-spring-like elastic elements 26. While in each case one end of the elastic elements 26 is connected to the central part 25, the other ends of the elements 26 are each connected to the frame 21. The central parts 24 of the attachment members 22 butt, by way of bearing surfaces 27, against the attachment surfaces 23 of the beam splitter cube 10.

Figure 2:
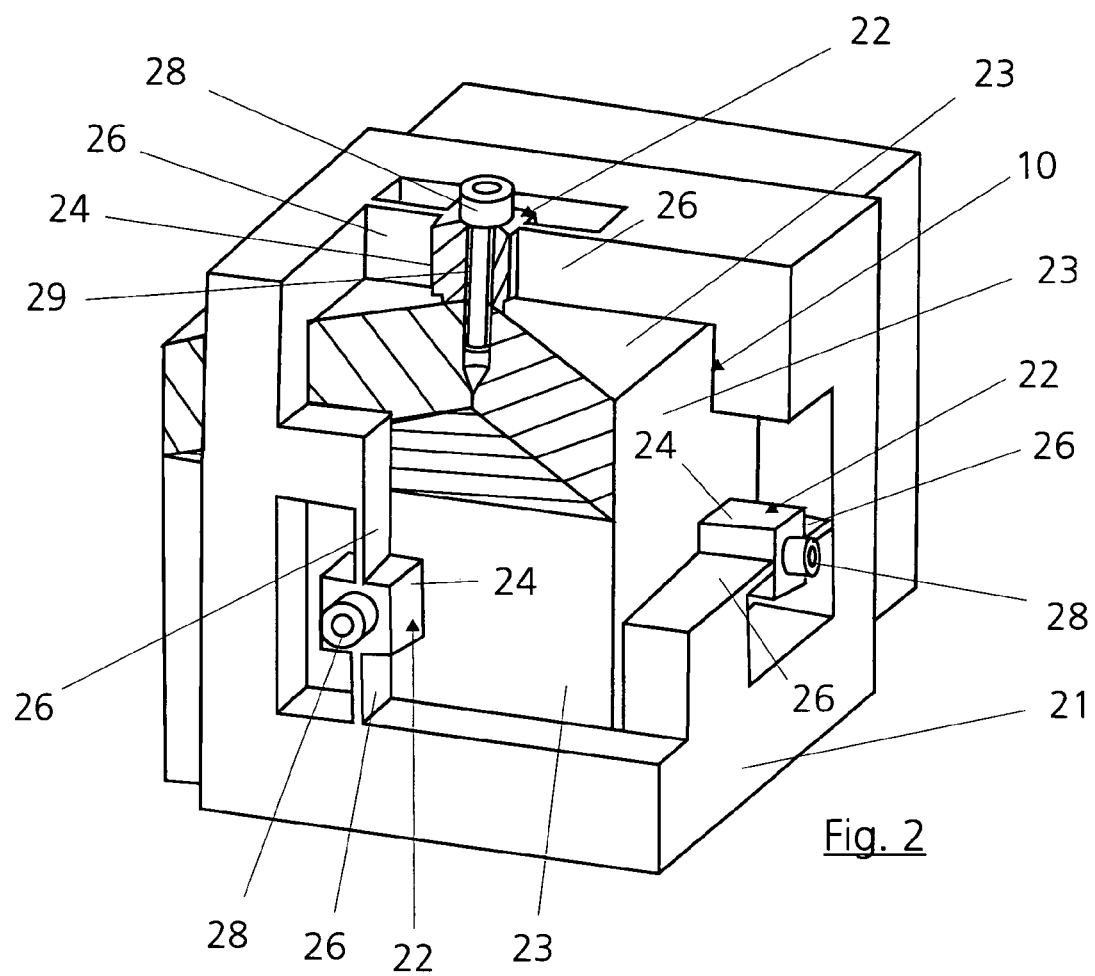
FIG. 2 shows a beam splitter cube which is mounted in a frame.

The bore 25 of the central part 24 contains a screw 28, which is screwed into a threaded bore 29 of the beam splitter cube 10 in each case (see the partially broken-away illustration of the beam splitter cube in FIG. 2).

Figure 3:
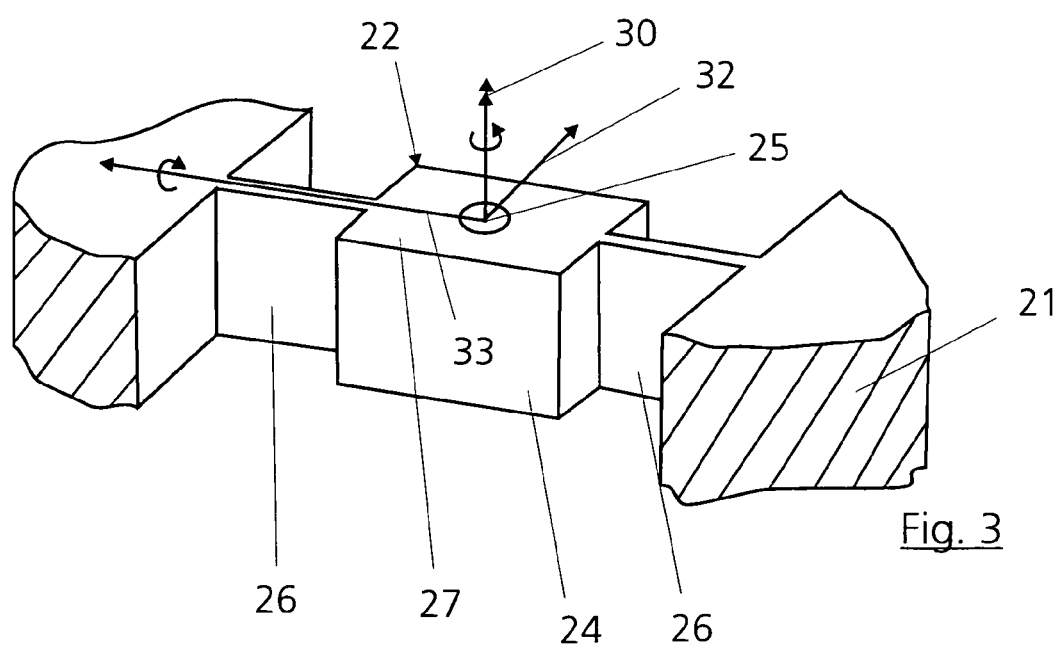
FIG. 3 shows an enlarged illustration of a bearing device for the beam splitter cube.

In the case of the bearing device according to FIGS. 2 and 3, there are two degrees of rotational freedom and two degrees of translational freedom per attachment member 22 during installation.

As can be seen from FIG. 3 in conjunction with FIG. 2, vertical rotation 30 about the longitudinal axis of the screw and axial rotation 31 about the longitudinal axes of the leaf-spring-like elastic elements 26 are possible in each case. In addition, on account of the elasticity of the elements 26, a lateral translational movement 32 in the direction transverse to the longitudinal axis of the leaf-spring-like elements 26 is possible. Furthermore, prior to the beam splatter cube 10 being connected to the frame 21 via the three screws 28, a lateral translational movement in the longitudinal direction of the elastic elements 26 is also possible in each case, as is indicated by the dashed arrow 33 in FIG. 3. The possibility of lateral translational movement in arrow direction 33, however, is eliminated on account of the statics of the elastic elements 26 in this direction once the screws 28 have been screwed into the threaded bore 29 of the beam splitter element 10. As a result, once the beam splitter cube 10 has been connected to the frame 21 via the three screws 28, only a lateral translational movement 32 in the direction transverse to the longitudinal axes of the elements 26 and to the two rotational movements 30 and 31 is possible in each case.

Redundancy, which gives rise to deformation at the beam splitter cube 10, is present in the case of this type of mounting.

Figure 4:
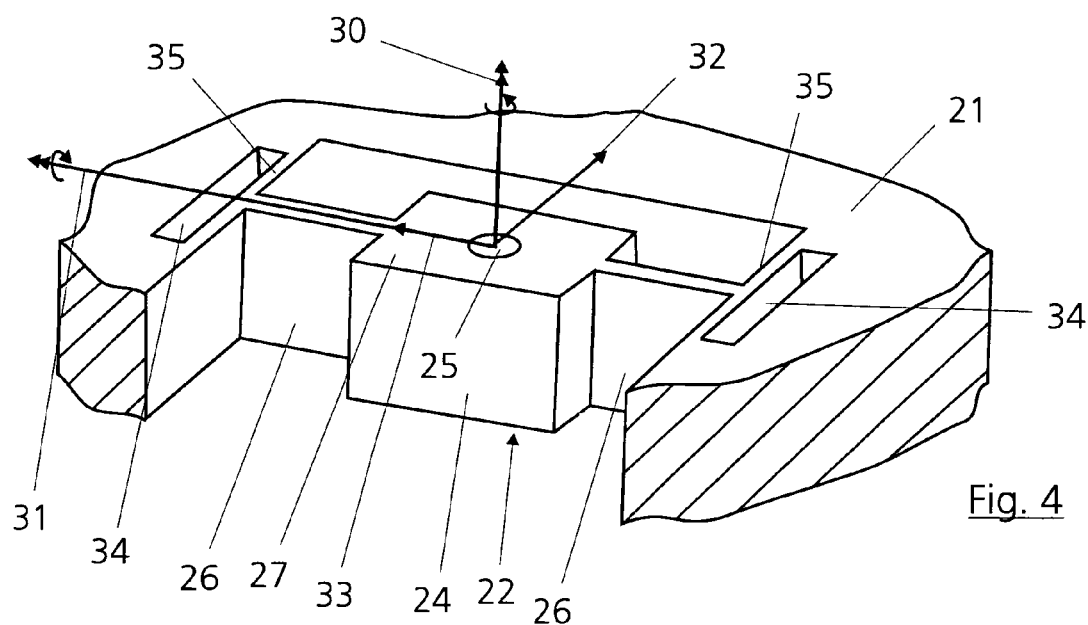
FIG. 4 shows an enlarged illustration of a bearing device for the beam splitter cube in a second embodiment.
Figure 5:
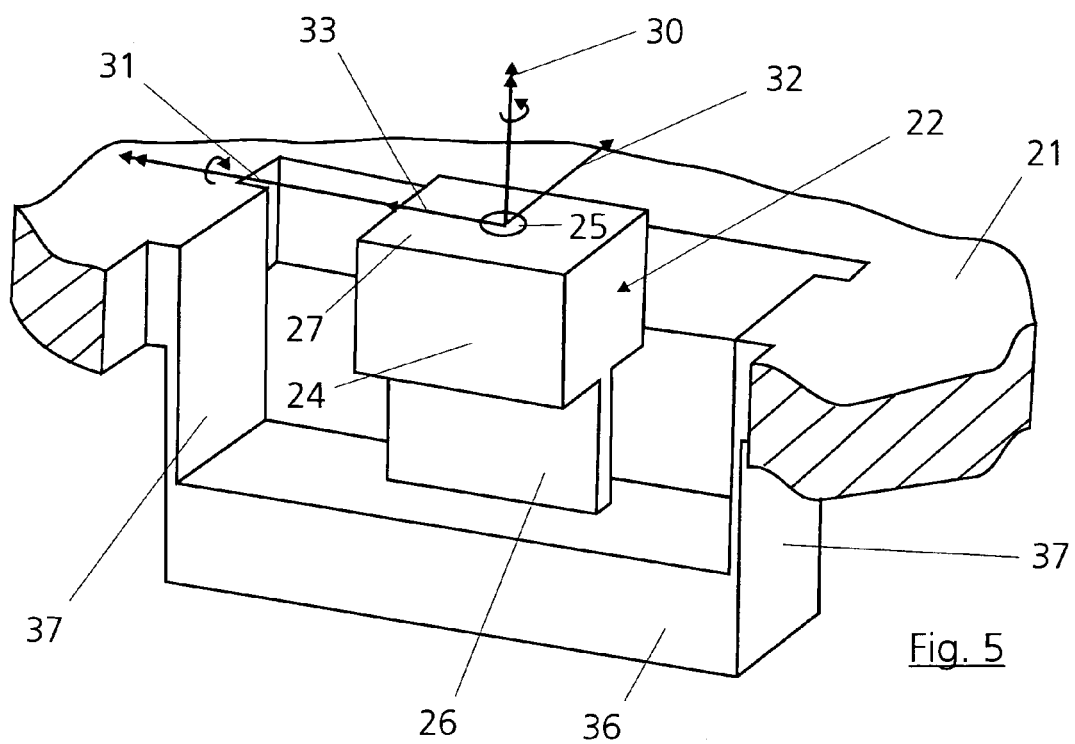
FIG. 5 shows an enlarged illustration of a bearing device for the beam splitter cube in a third embodiment.

FIGS. 4 and 5 illustrate mounting devices for the beam splitter cube 10 which still have two degrees of translational freedom present following installation.

Since essentially the same parts are used, and the same construction is present, in the case of the mounting devices illustrated in FIGS. 4 and 5, the same parts have also been provided with the same designations.

According to FIG. 4, the frame 21 is provided with two cut-outs 34 in the form of longitudinal grooves in each case in the region of its mounting devices. The cut-outs 34 extend transversely to the longitudinal axes of the leaf-spring-like elastic elements 26 and are each spaced apart from the outside of the frame 21, in the region of the connection between the elements 26 and the frame 21, such that only a narrow crosspiece 35 is present, this crosspiece likewise running transversely to the longitudinal axis or the elements 26. It is thus the case that the two elongate cut-outs 34, once the beam splitter cube 10 has been fixed 0 to the frame 21, still allow a lateral translational movement in arrow direction 33, since the narrow crosspieces 35 can flex like the leaf-spring-like elastic elements 26.

FIG. 5 illustrates a further possibility, in the case of which two lateral translational movements 32 and 33 are likewise possible following installation. In this case, this is made possible by a frame widening 36 which constitutes, at least more or less, a U-profile shape, with two legs 37 which, in relation to their respective longitudinal axes or the stiff surfaces thereof, run perpendicularly to the leaf-spring-like elastic element 26. As can be seen, this configuration provides just one leaf-spring-like elastic element 26, which is connected, on one side, to the central part 24 as the actual attachment member and, on the other side, to the transverse part of the U-profile between the two legs 37.

In addition to the two degrees of rotational freedom 30 and 31, the elasticity of the element 26 allows a lateral translational movement 32 and the elasticity of the two leas 37 allows a translational movement 33 which is perpendicular thereto.

FIG. 6 shows a configuration of a device which is intended for connecting the beam splitter cube 10 to the frame 21 and in which the attachment members 22 slant, or are located at an angle, in relation to the edges of the beam splitter cube 10. If the angle at which the leaf-spring-like elements 26 are connected to the sides of the frame 21 is 45°, in which case the attachment members 22 run diagonally on the attachment surfaces 23, then the lines of effect of the possible lateral translational movements intersect one another at a point P, as can be seen from the effect-indicating arrows 38, 39 and 40. Point P is located at a corner of the beam splitter cube 10. Since the movement directions are directed toward the point P, temperature compensation is achieved; that is to say, on account of different temperature expansions of the beam splitter cube 10 and frame 21, there is no change in the shape of the beam splitter cube 10.

FIG. 7 shows a variant in respect of the screw 28 as connecting member between the frame 21 and the beam splitter cube 20. In the case of this exemplary embodiment, it is possible to adjust the contact-pressure force. This is achieved by a stressed spring 41 which prevents the attachment surface 23 of the beam splitter cube 10 from lifting off from the bearing surface 27 of the attachment member 22, to be precise by producing a tensile force between a bolt 42 and a bolt 43, over which the ends of the spring 41 are wound in each case. The bolt 42 is located on an insert sleeve 44 in the beam splitter cube 10. The connection between the insert sleeve 44 and the beam splitter cube 10 or between the spring 41 and the bolt 42 will preferably be provided as a quick-acting closure, for example as a bayonet closure, in order thus to allow quick release and reconnection during installation and removal.

The bolt 43 is connected to a screw 45 which is screwed into the central part 24 of the attachment member 22.

The screw 45 can be used to adjust the tensile force of the spring 41 such that, upon removal and reinstallation, the beam splitter cube 10 undergoes the same deformation as before.

FIG. 8 shows another possible way of regulating the contact-pressure force between the beam splatter cube 10 and the attachment member 22 as part of the frame 21. In the case of FIG. 8, the contact-pressure force is produced by a magnet 46 with a north pole and a south pole, of which the magnetic flux runs via a sleeve 47 in the beam splitter cube 10 and a sleeve 48 in the attachment member 22. Adjustment of an adjusting screw 49, which is fixed to the magnet 46, allows the contact-pressure force between the beam splitter cube 10 and the attachment member 22 to be adjusted, in turn, such that, upon reinstallation, the beam splitter cube 10 assumes the same deformation as during earlier installation.

The invention has been described, in the case of the exemplary embodiment; with reference to a beam splitter cube. However, it is, of course, also suitable for other types of rotationally asymmetric optical elements, for example a prism or a double mirror.

Instead of fixing via the three screws 28 or the connecting members illustrated in FIGS. 7 and 8, by means of which it is possible to regulate the contact-pressure force, it is, of course, also possible to have other connecting members within the context of the invention.

What is claimed is:

1. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members, wherein at least one attachment member is configured to provide two degrees of rotational freedom;
   wherein said attachment members are designed as solid-state articulations;
   wherein said solid-state articulations form part of the frame;
   wherein said solid-state articulations comprise leaf-spring-like elastic elements;
   wherein each attachment member is provided with at least two leaf-spring-like elastic elements, which are arraigned perpendicularly to one another; and
   wherein said mutually perpendicular arrangement of the leaf-spring-like elastic elements is provided by a widening of the frame in U-profile form, two legs of the U-profile forming the leaf-spring-like elastic elements.

2. Low-deformation mounting device of a rotationally asymmetric optical element, which is mounted in a frame, at least three attachment surfaces which are located orthogonally in relation to one another being provided on the optical element, and wherein attachment members for attachment to the frame being arranged such that in each case at least one but no more than two degrees of translational freedom and degrees of rotational freedom are provided by the attachment members;
   wherein said attachment members are designed as solid-state articulations;
   wherein said solid-state articulations form part of the frame;
   wherein said solid-state articulations comprise leaf-spring-like elastic elements;
   wherein each attachment member is provided with at least two leaf-spring-like elastic elements, which are arranged perpendicularly to one another; and
   wherein said mutually perpendicular arrangement of the leaf-spring-like elastic elements is provided by a widening of the frame in U-profile form, two legs of the U-profile forming the leaf-spring-like elastic elements.

3. The device as claimed in claim 1 or 2, wherein said attachment members are each provided with a connecting member fixing said optical element to the frame.

4. The device as claimed in claim 3, wherein the lines of effect of the possible lateral translational movements intersect one another at a point (P).

5. The device as claimed in claim 4, wherein said attachment members slant in relation to edges of said attachment surfaces of said optical element, the lines of effect of the possible lateral translational movements intersecting one another at a corner (P) of said optical element.

6. The device as claimed in claim 1 or 2, wherein the connection to the optical element taking place between the at least two leaf-spring-like elastic elements.

7. The device as claimed in claim 1 or 2, wherein each attachment member is arranged between four leaf-spring-like, elastic elements, in each case two leaf-spring-like elastic elements which are arranged perpendicularly to one another being provided on each side of the attachment member.

8. The device as claimed in claim 7, wherein in each case one of the two leaf-spring-like elastic element which are located on one side of an attachment member is formed by a cut-out in the frame.

9. The device as claimed in claim 3, wherein said connecting members are designed as screws which are mounted in the frame and are screwed into the optical element.

10. The device as claimed in claim 1 or 2, wherein said optical element is a beam splitter cube.

11. The device as claimed in claim 1 or 2, wherein said optical element is a prism.

12. The device as claimed in claim 1 or 2, wherein said optical element is a double mirror.

13. The device as claimed in claim 1, wherein the at least one attachment member is arranged to provide two degrees of translational freedom.

14. The device as claimed in claim 2, wherein at least one attachment member is arranged to provide two degrees of rotational freedom.

15. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members;

wherein said attachment members are designed as solid-state articulations;

wherein said solid-state articulations form part of the frame;

wherein said solid-state articulations comprise leaf-spring-like elastic elements;

wherein each attachment member is provided with at least two leaf-spring-like elastic elements, which are arranged perpendicularly to one another; and wherein said mutually perpendicular arrangement of the leaf-spring-like elastic elements is provided by a widening of the frame in U-profile form, two legs of the U-profile forming the leaf-spring-like elastic elements.

16. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members;

wherein the contact-pressure forces of the attachment members are adjustable to said optical element; and wherein said contact-pressure forces are adjustable by spring members which are provided with adjusting members which adjust the spring-prestressing force.

17. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members;

wherein the contact-pressure forces of the attachment members are adjustable to said optical element; and wherein said contact-pressure forces are adjustable by magnetic members, wherein the magnetic force is adjustable by adjusting members.

18. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members, wherein at least one attachment member is configured to provide two degrees of rotational freedom;

wherein the contact-pressure forces of the attachment members are adjustable to said optical element; and wherein said contact-pressure forces are adjustable by spring members which are provided with adjusting members which adjust the spring-prestressing force.

19. Low-deformation mounting device of a rotationally asymmetric optical element, which is mounted in a frame, at least three attachment surfaces which are located orthogonally in relation to one another being provided on the optical element, and wherein attachment members for attachment to the frame being arranged such that in each case at least one but no more than two degrees of translational freedom and degrees of rotational freedom are provided by the attachment members;

wherein the contact-pressure forces of the attachment members are adjustable to said optical element; and wherein said contact-pressure forces are adjustable by spring members which are provided with adjusting members which adjust the spring-prestressing force.

20. Low-deformation mounting device of a rotationally asymmetric optical element, which is mounted in a frame, at least three attachment surfaces which are located in an angle in relation to one another being provided on the optical element, and wherein attachment members for attachment to the frame being arranged such that in each case at least one but no more than two degrees of translational freedom and degrees of rotational freedom are provided by the attachment members, wherein at least one attachment member is configured to provide two degrees of rotational freedom;

wherein the contact-pressure forces of the attachment members are adjustable to said optical element; and wherein said contact-pressure forces are adjustable by magnetic members, wherein the magnetic force is adjustable by adjusting members.

21. Low-deformation mounting device of a rotationally asymmetric optical element, which is mounted in a frame, at least three attachment surfaces which are located orthogonally in relation to one another being provided on the optical element, and wherein attachment members for attachment to the frame being arranged such that in each case at least one but no more than two degrees of translational freedom and degrees of rotational freedom are provided by the attachment members;

wherein the contact-pressure forces of the attachment members are adjustable to said optical element; and wherein said contact-pressure forces are adjustable by magnetic members, wherein the magnetic force is adjustable by adjusting members.

* * * * *

UNITED STATES PATENT AND TRADEMARK OFFICE
CERTIFICATE OF CORRECTION

| | |
|---|---|
| PATENT NO. | : 7,362,520 B2 |
| APPLICATION NO. | : 10/964601 |
| DATED | : April 22, 2008 |
| INVENTOR(S) | : Ulrich Weber |

Page 1 of 2

It is certified that error appears in the above-identified patent and that said Letters Patent is hereby corrected as shown below:

On face page of patent, please insert under (73) Assignee:
--Carl Zeiss SMT AG, Oberkochen (DE)--

Col. 1, line 35 -
Replace "chances in respect of the imaging quality of the projection"
With --changes in respect of the imaging quality of the projection--

Col. 1, line 50 -
Replace "installation and operation not to give rise to any chances in"
With --installation and operation not to give rise to any changes in--

Col. 2, line 61 -
Replace "FIG. 1 illustrates., in principle, a projection exposure"
With --FIG. 1 illustrates, in principle, a projection exposure--

Col. 3, line 22 -
Replace "group 17. The π/4 plate 15 is located in the beam path of the"
With --group 17. The λ/4 plate 15 is located in the beam path of the--

Col. 3, line 28 -
Replace "more detail the beam splitter cube 10 wish its bearing"
With --more detail the beam splitter cube 10 with its bearing--

Col. 3, line 65 -
Replace "26 is possible. Furthermore, prior to the beam splatter cube"
With --26 is possible. Furthermore, prior to the beam splitter cube--

Col. 4, line 30 -
Replace "running transversely to the longitudinal axis or the elements"
With --running transversely to the longitudinal axis of the elements--

Col. 4, line 31 -
Replace "the beam splitter cute 10 has been fixed 0 to the frame 21,"
With --the beam splitter cute 10 has been fixed to the frame 21,--

UNITED STATES PATENT AND TRADEMARK OFFICE
CERTIFICATE OF CORRECTION

PATENT NO. : 7,362,520 B2
APPLICATION NO. : 10/964601
DATED : April 22, 2008
INVENTOR(S) : Ulrich Weber It is certified that error appears in the above-identified patent and that said Letters Patent is hereby corrected as shown below:

Col. 4, line 51 -
 Replace "translational movement 32 and the elasticity of the two leas"
 With --translational movement 32 and the elasticity of the two legs--

Col. 5, line 38 -
 Replace "exemplary embodiment; with reference to a beam splitter"
 With --exemplary embodiment, with reference to a beam splitter--

Col. 5, line 67, claim 1-
 Replace "arraigned perpendicularly to one another, and"
 With --arranged perpendicularly to one another, and--

Col. 6, line 48, claim 8 -
 Replace "one of the two leaf-spring-like elastic element which are"
 With --one of the two leaf-spring-like elastic elements which are--

Signed and Sealed this

Tenth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,362,520 B2
APPLICATION NO. : 10/964601
DATED : April 22, 2008
INVENTOR(S) : Ulrich Weber It is certified that error appears in the above-identified patent and that said Letters Patent is hereby corrected as shown below:

On face page of patent, please insert under (73) Assignee:
--Carl Zeiss SMT AG, Oberkochen (DE)--

Col. 1, line 35 -
Replace "chances in respect of the imaging quality of the projection"
With --changes in respect of the imaging quality of the projection--

Col. 1, line 50 -
Replace "installation and operation not to give rise to any chances in"
With --installation and operation not to give rise to any changes in--

Col. 2, line 61 -
Replace "FIG. 1 illustrates., in principle, a projection exposure"
With --FIG. 1 illustrates, in principle, a projection exposure--

Col. 3, line 22 -
Replace "group 17. The π/4 plate 15 is located in the beam path of the"
With --group 17. The λ/4 plate 15 is located in the beam path of the--

Col. 3, line 28 -
Replace "more detail the beam splitter cube 10 wish its bearing"
With --more detail the beam splitter cube 10 with its bearing--

Col. 3, line 65 -
Replace "26 is possible. Furthermore, prior to the beam splatter cube"
With --26 is possible. Furthermore, prior to the beam splitter cube--

Col. 4, line 30 -
Replace "running transversely to the longitudinal axis or the elements"
With --running transversely to the longitudinal axis of the elements--

Col. 4, line 31 -
Replace "the beam splitter cute 10 has been fixed 0 to the frame 21,"
With --the beam splitter cube 10 has been fixed to the frame 21,--

UNITED STATES PATENT AND TRADEMARK OFFICE
CERTIFICATE OF CORRECTION

PATENT NO. : 7,362,520 B2
APPLICATION NO. : 10/964601
DATED : April 22, 2008
INVENTOR(S) : Ulrich Weber It is certified that error appears in the above-identified patent and that said Letters Patent is hereby corrected as shown below:

Col. 4, line 51 -
    Replace "translational movement 32 and the elasticity of the two leas"
    With --translational movement 32 and the elasticity of the two legs--

Col. 5, line 38 -
    Replace "exemplary embodiment; with reference to a beam splitter"
    With --exemplary embodiment, with reference to a beam splitter--

Col. 5, line 67, claim 1 -
    Replace "arraigned perpendicularly to one another, and"
    With --arranged perpendicularly to one another, and--

Col. 6, line 48, claim 8 -
    Replace "one of the two leaf-spring-like elastic element which are"
    With --one of the two leaf-spring-like elastic elements which are--

This certificate supersedes the Certificate of Correction issued March 10, 2009.

Signed and Sealed this

Seventh Day of April, 2009

JOHN DOLL
*Acting Director of the United States Patent and Trademark Office*